(12) United States Patent
Rios et al.

(10) Patent No.: US 11,211,115 B2
(45) Date of Patent: Dec. 28, 2021

(54) ASSOCIATIVITY-AGNOSTIC IN-CACHE COMPUTING MEMORY ARCHITECTURE OPTIMIZED FOR MULTIPLICATION

(71) Applicant: ECOLE POLYTECHNIQUE FEDERALE DE LAUSANNE (EPFL), Lausanne (CH)

(72) Inventors: Marco Antonio Rios, Chavannes-Renens (CH); William Andrew Simon, Prilly (CH); Alexandre Sébastien Levisse, Lausanne (CH); Marina Zapater, Chavannes-Renens (CH); David Atienza Alonso, Echandens-Denges (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 15 days.

(21) Appl. No.: 16/866,570

(22) Filed: May 5, 2020

(65) Prior Publication Data
US 2021/0350846 A1 Nov. 11, 2021

(51) Int. Cl.
*G11C 7/10* (2006.01)
*G11C 11/419* (2006.01)
(Continued)

(52) U.S. Cl.
CPC .......... *G11C 11/419* (2013.01); *G11C 7/1006* (2013.01); *G11C 11/418* (2013.01); *G06F 7/523* (2013.01)

(58) Field of Classification Search
CPC ... G11C 11/419; G11C 11/418; G11C 7/1006; G06F 7/523
See application file for complete search history.

(56) References Cited

U.S. PATENT DOCUMENTS

| | | | | |
|---|---|---|---|---|
| 5,535,172 A | * | 7/1996 | Reddy | G11C 7/18 365/189.02 |
| 6,058,065 A | * | 5/2000 | Lattimore | G11C 7/18 365/230.03 |

(Continued)

OTHER PUBLICATIONS

Jonathan Chang et al., "A 7nm 256Mb SRAM in High-K Metal Gate FinFET Technology with Wrtie-Assist Circtuiry for Low-VMIN Applications", 2017 IEEE International Solid State Circuits Conference (ISSCC), Feb. 2017, IEEE, pp. 206-207. (Year: 2017).*

(Continued)

*Primary Examiner* — Jay W. Radke

(74) *Attorney, Agent, or Firm* — Andre Roland S.A.; Nikolaus Schibli

(57) ABSTRACT

A random access memory array including a plurality of local memory group ways, each local memory group way including, a plurality of local memory groups, each local memory group including, a memory column including a plurality of memory cells, a pair of local bitlines operatively connected to the plurality of memory cells, and a local group periphery including a local bitline multiplexer operatively connected with the pairs of local bitlines of the corresponding local memory group; and a pair of global read bitlines operatively connected to outputs of the plurality of local group peripheries, a global read bitline multiplexer operatively connected to outputs of the plurality of pairs of the global read bitlines from the local memory group ways, and a bitline operational block operatively connected an output of the global read bitline multiplexer.

20 Claims, 14 Drawing Sheets

(51) Int. Cl.
  *G11C 11/418* (2006.01)
  *G06F 7/523* (2006.01)

(56) References Cited

U.S. PATENT DOCUMENTS

| | | | | |
|---|---|---|---|---|
| 6,327,197 | B1* | 12/2001 | Kim | G11C 29/808 |
| | | | | 365/185.09 |
| 7,099,202 | B1* | 8/2006 | Son | G11C 7/10 |
| | | | | 365/189.02 |
| 11,074,963 | B2* | 7/2021 | Huang | G11C 11/4093 |
| 2009/0040840 | A1* | 2/2009 | Lee | G11C 7/02 |
| | | | | 365/189.11 |
| 2009/0196117 | A1* | 8/2009 | Sutardja | G11C 7/18 |
| | | | | 365/230.03 |
| 2010/0260002 | A1* | 10/2010 | Chen | G11C 11/413 |
| | | | | 365/207 |
| 2011/0128781 | A1* | 6/2011 | Murata | G11C 16/24 |
| | | | | 365/182 |
| 2013/0028032 | A1 | 1/2013 | Koike et al. | |
| 2020/0365200 | A1* | 11/2020 | Huang | G11C 11/4085 |

OTHER PUBLICATIONS

Aga, S., Jeloka, S., Subramaniyan, A., Narayanasamy, S., Blaauw, D., & Das, R. (Feb. 2017). Compute caches. In 2017 IEEE International Symposium on High Performance Computer Architecture (HPCA) (pp. 481-492). IEEE.

Agrawal, A., Jaiswal, A., Lee, C., & Roy, K. (2018). X-sram: Enabling in-memory boolean computations in cmos static random access memories. IEEE Transactions on Circuits and Systems I: Regular Papers, 65(12), 4219-4232.

Akyel, K. C., Charles, H. P., Mottin, J., Giraud, B., Suraci, G., Thuries, S., & Noel, J. P. (Oct. 2016). DRC 2: Dynamically Reconfigurable Computing Circuit based on memory architecture. In 2016 IEEE International Conference on Rebooting Computing (ICRC) (pp. 1-8). IEEE.

B. Reese. (Jan. 2019) Ai at the edge: A gigaom research byte. GigaOm.

Chan, P. K., & Schlag, M. D. F. (1990). Analysis and design of CMOS Manchester adders with variable carry-skip. IEEE Transactions on Computers, 39(8), 983-992.

Chang, L., Nakamura, Y., Montoye, R. K., Sawada, J., Martin, A. K., Kinoshita, K., . . . & Hosokawa, K. (Jun. 2007). A 5.3 GHz 8T-SRAM with operation down to 0.41 V in 65nm CMOS. In 2007 IEEE Symposium on VLSI Circuits (pp. 252-253). IEEE.

Chang, M. C., Pan, Z. G., & Chen, J. L. (Oct. 2017). Hardware accelerator for boosting convolution computation in image classification applications. In 2017 IEEE 6th Global Conference on Consumer Electronics (GCCE) (pp. 1-2). IEEE.

Chang, M. F., Chen, C. F., Chang, T. H., Shuai, C. C., Wang, Y. Y., & Yamauchi, H. (Feb. 2015). 17.3 A 28nm 256kb 6T SRAM with 280mV improvement in V MIN using a dual-split-control assist scheme. In 2015 IEEE International Solid-State Circuits Conference-(ISSCC) Digest of Technical.

Deng, Q., Jiang, L., Zhang, Y., Zhang, M., & Yang, J. (Jun. 2018). DrAcc: a DRAM based accelerator for accurate CNN inference. In Proceedings of the 55th Annual Design Automation Conference (pp. 1-6).

Dong, Q., Jeloka, S., Saligane, M., Kim, Y., Kawaminami, M., Harada, A., . . . & Sylvester, D. (Jun. 2017). A 0.3 V VDDmin 4+ 2T SRAM for searching and in-memory computing using 55nm DDC technology. In 2017 Symposium on VLSI Circuits (pp. C160-C161). IEEE.

Eckert, C., Wang, X., Wang, J., Subramaniyan, A., Iyer, R., Sylvester, D., . . . & Das, R. (Jun. 2018). Neural cache: Bit-serial in-cache acceleration of deep neural networks. In 2018 ACM/IEEE 45th Annual International Symposium on Computer Architecture (ISCA) (pp. 383-396). IEEE.

Haj-Ali, A., Ben-Hur, R., Wald, N., & Kvatinsky, S. (May 2018). Efficient algorithms for in-memory fixed point multiplication using magic. In 2018 IEEE International Symposium on Circuits and Systems (ISCAS) (pp. 1-5). IEEE.

Jeloka, S., Akesh, N. B., Sylvester, D., & Blaauw, D. (2016). A 28 nm configurable memory (TCAM/BCAM/SRAM) using push-rule 6T bit cell enabling logic-in-memory. IEEE Journal of Solid-State Circuits, 51(4), 1009-1021.

Kang, M., Kim, E. P., Keel, M. S., & Shanbhag, N. R. (May 2015). Energy-efficient and high throughput sparse distributed memory architecture. In 2015 IEEE International Symposium on Circuits and Systems (ISCAS) (pp. 2505-2508). IEEE.

Kooli, M., Charles, H. P., Touzet, C., Giraud, B., & Noel, J. P. (Mar. 2018). Smart instruction codes for in-memory computing architectures compatible with standard sram interfaces. In 2018 Design, Automation & Test in Europe Conference & Exhibition (DATE) (pp. 1634-1639). IEEE.

Pilo, H., Adams, C. A., Arsovski, I., Houle, R. M., Lamphier, S. M., Lee, M. M., . . . & Younus, M. I. (Feb. 2013). A 64Mb SRAM in 22nm SOI technology featuring fine-granularity power gating and low-energy power-supply-partition techniques for 37% leakage reduction. In 2013 IEEE International.

Seshadri, V., Lee, D., Mullins, T., Hassan, H., Boroumand, A, Kim, J., . . . & Mowry, T. C. (Oct. 2017). Ambit: In-memory accelerator for bulk bitwise operations using commodity DRAM technology. In 2017 50th Annual IEEE/ACM International Symposium on Microarchitecture (MICRO) (pp. 273-287).

Simon, W. A., Qureshi, Y. M., Levisse, A., Zapater, M., & Atienza, D. (May 2019). BLADE: A BitLine Accelerator for Devices on the Edge. In Proceedings of the 2019 on Great Lakes Symposium on VLSI (pp. 207-212).

Simon, W., Galicia, J., Levisse, A., Zapater, M., & Atienza, D. (Jun. 2019). A fast, reliable and wide-voltage-range in-memory computing architecture. In 2019 56th ACM/IEEE Design Automation Conference (DAC) (pp. 1-6). IEEE.

Sinangil, M. E., Mair, H., & Chandrakasan, A. P. (Feb. 2011). A28nm high-density 6T SRAM with optimized peripheral-assist circuits for operation down to 0.6 V. In 2011 IEEE International Solid-State Circuits Conference (pp. 260-262). IEEE.

Subramaniyan, A., Wang, J., Balasubramanian, E. R., Blaauw, D., Sylvester, D., & Das, R. (Oct. 2017). Cache automaton. In Proceedings of the 50th Annual IEEE/ACM International Symposium on Microarchitecture (pp. 259-272).

Wu, S. L., Li, K. Y., Huang, P. T., Hwang, W Tu, M. H., Lung, S. C., . . . & Chuang, C. T. (2017). A 0.5-V 28-nm 256-kb mini-array based 6T SRAM with Vtrip-tracking write-assist. IEEE Transactions on Circuits and Systems I: Regular Papers, 64(7), 1791-1802.

Simon, W. A., Qureshi, Y. M., Rios, M., Levisse, A., Zapater, M., & Atienza, D. (2020). An in-cache computing architecture for edge devices. IEEE Transactions on Computers.

\* cited by examiner

| C - Binary | C - Decimal | $b_n$ | Operation | Cycle |
|---|---|---|---|---|
| 0 | 0 | 0 | Shift (C) | 2 |
| 0 | 0 | 1 | Shift (C) | 4 |
| 1 0 1 0 | 10 | | Add (C,A) | 6 |
| 1 0 1 0 0 | 20 | 0 | Shift (C) | 8 |
| 1 0 1 0 0 0 | 40 | 0 | Shift (C) | 10 |
| 1 0 1 0 0 0 0 | 80 | 1 | Shift (C) | 12 |
| 1 0 1 1 0 1 0 | 90 | | Add (C,A) | 14 |

| Result Vector (C) | $b_n$ | $N_{ES}=0$ | $N_{ES}=1$ | $N_{ES}=2$ | $N_{ES}=3$ |
|---|---|---|---|---|---|
| 0 | 0 | Shift (C) | Shift (C) | | |
| 0 | 1 | Shift (C) + Add (C,A) | Shift (C) + Add(C,A) | 2×Shift (C) + Add(C,A) | 2×Shift (C) + Add(C,A) |
| 1 0 1 0 0 | 0 | Shift (C) | Shift (C) | 2×Shift (C) | |
| 1 0 1 0 0 0 | 0 | Shift (C) | Shift (C) | | 3×Shift (C) + Add(C,A) |
| 1 0 1 1 0 1 0 | 1 | Shift (C) + Add (C,A) | Shift (C) + Add(C,A) | Shift (C) + Add(C,A) | |

FIG. 11

ASSOCIATIVITY-AGNOSTIC IN-CACHE COMPUTING MEMORY ARCHITECTURE OPTIMIZED FOR MULTIPLICATION

FIELD OF THE INVENTION

The present invention is directed to the field of memory data management and computing, and memory architectures, specifically in-memory computing and bitline computing, for example in-cache computing for random access memories (RAM).

BACKGROUND

With the spread of cloud services, Internet of Things (IoT) concept and distributed networked computing, there is a popularization of machine learning and artificial intelligence-based analytics of large and diverse data volumes. However, an efficient deployment of these data-intensive services requires performing computations closer to the "edge," for example closer to the physical memory storage of the data of networked devices, for example random access memories of devices that are collecting the data or processing data locally, such as but not limited to sensors, microphones, cameras, weather stations, cellphones, autonomous car, UAV. In this context, in-cache computing, for example based on bitline computing, is promising to execute data-intensive algorithms in an energy efficient way by mitigating data movement into the cache hierarchy and exploiting data parallelism.

With respect to machine learning, Deep Neural Networks (DNN) are becoming increasingly complex and computation-intensive, while simultaneously becoming more pervasive across different types of device, including low power and area constrained devices on the so-called "edge". In this context, energy efficiency as well as design and manufacturing costs become critical, calling for new accelerators and architectural innovations that provide both high efficiency and high scalability while remaining low-cost. Among the explored opportunities, near data processing (NDP) or in-memory computing, for example in-RAM computing or in-storage computing (iSC), appears as a promising solution, as it mitigates data movement in the cache hierarchy, and thereby reduces energy consumption, and enables ultra-wide Single Instruction Multiple Data (SIMD) operations while being compact and not making drastic changes in the architecture design and usage.

Many of the current iSC solutions are based on BitLine (BL) computing, a technique using simultaneous activation of two or more WordLines (WL) in a random access memory (RAM) array, for example a static random access memory (SRAM) array. This simultaneous WL activation results in the corresponding BLs carrying out the bitwise AND and NOR operations between the words of the accessed WLs. While bitwise operations can be useful in some cases, around 90% of the operations executed in DNNs are convolutions, which require word level multiplications. Among the state-of-the-art works, references [7] and [8] only support bitwise operations, while some state of the art only suggests to implement support for addition (ADD) and SHIFT which, when chained, can be used to perform multiplication.

Nevertheless, previous in-cache computing architectures contain serious circuit-level deficiencies, for example but not limited to low bitcell density, data corruption risks, and limited performance, thus report high multiplication latency, which is a key operation for machine learning and deep learning. Moreover, no previous work addresses the issue of way misalignment, strongly constraining data placement not to reduce performance gains. In light of these deficiencies of the state of the art, substantially improved solutions and architectures for in-memory computing are desired, specifically to improve the performance of multiplications, and to improve latency times.

SUMMARY

According to one aspect of the present invention, a random access memory (RAM) array is provided. Preferably, the random access memory array includes a plurality of local memory group ways, each local memory group way including, a plurality of local memory groups, each local memory group including, a memory column including a plurality of memory cells, a pair of local bitlines operatively connected to the plurality of memory cells, and a local group periphery including a local bitline multiplexer operatively connected with the pairs of local bitlines of the corresponding local memory group; and a pair of global read bitlines operatively connected to outputs of the plurality of local group peripheries; a global read bitline multiplexer operatively connected to outputs of the plurality of pairs of the global read bitlines from the local memory group ways; and a bitline operational block operatively connected to an output of the global read bitline multiplexer.

According to still another aspect of the present invention, preferably, the local group periphery preferably includes a pair of local amplifiers having inputs that are connected to outputs of the local bitline multiplexer, a pair of local read ports each associated with a corresponding one of the local amplifiers; and a pair of embedded shift circuits operatively connected to the pair of local read ports, respectively, outputs of the pair of shift circuits providing for an embedded shift number, operatively connected to a corresponding one of the pair of global read bitlines.

According to another aspect of the present invention, preferably, the RAM memory array further includes a word line driver operatively connected to word lines of the memory array, two word line decoders operatively connected to inputs of the word line driver to provide for decoded addresses, a word line fusion circuit operatively connected to the decoded addresses, and a subarray controller having a multiplication controller.

According to yet another aspect of the present invention, a memory chip is provided. Preferably, the memory chip includes a plurality of local memory group arrays, each array including a plurality of local memory group ways, each local memory group way including, a plurality of local memory groups, each local memory group including, a memory column including a plurality of memory cells, a pair of local bitlines operatively connected to the plurality of memory cells, and a local group periphery including a local bitline multiplexer operatively connected with the pairs of local bitlines of the corresponding local memory group; and a pair of global read bitlines operatively connected to outputs of the plurality of local group peripheries; a global read bitline multiplexer operatively connected to outputs of the plurality of pairs of the global read bitlines from the local memory group ways; and a bitline operational block operatively connected an output of the global read bitline multiplexer.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE SEVERAL VIEWS OF THE DRAWINGS

The accompanying drawings, which are incorporated herein and constitute part of this specification, illustrate the presently preferred embodiments of the invention, and together with the general description given above and the detailed description given below, serve to explain features of the invention.

FIG. 1B shows an exemplary representation of a Local Group Periphery (LGP) block schematic that is associated to each local group LG, FIG. 1C shows schematic details of a possible implementation of the Local Group Periphery (LGP) block schematic with a local bitline multiplexer, FIG. 1D shows an exemplary representation of a schematic of a bitline operational block BOB, FIG. 1E shows a variant of the memory architecture with an exemplary schematic of the associativity-agnostic memory organization with a local bitline (BL) multiplexer, and a modified local group (LG) periphery that is common to a plurality of local groups LG, so that one LG periphery is shared via local BL multiplexer, and FIG. 1F shows exemplary schematic representation of the memory architecture that is shown generically in FIG. 1A with a 256×2×32 with the bitline operational block BOB, using latches L at the outputs of the amplifiers SA and before the input to the adder circuit, according to an aspect of the present invention;

FIG. 11 shows a table with an extended multiplication example, with the operations performed by the controller for the parameters NES going from 0 to 4;

Herein, identical reference characters are used, where possible, to designate identical elements that are common to the figures. Also, the images in the drawings are simplified for illustration purposes and may not be depicted to scale.

DETAILED DESCRIPTION OF THE SEVERAL EMBODIMENTS

Figure 1A:
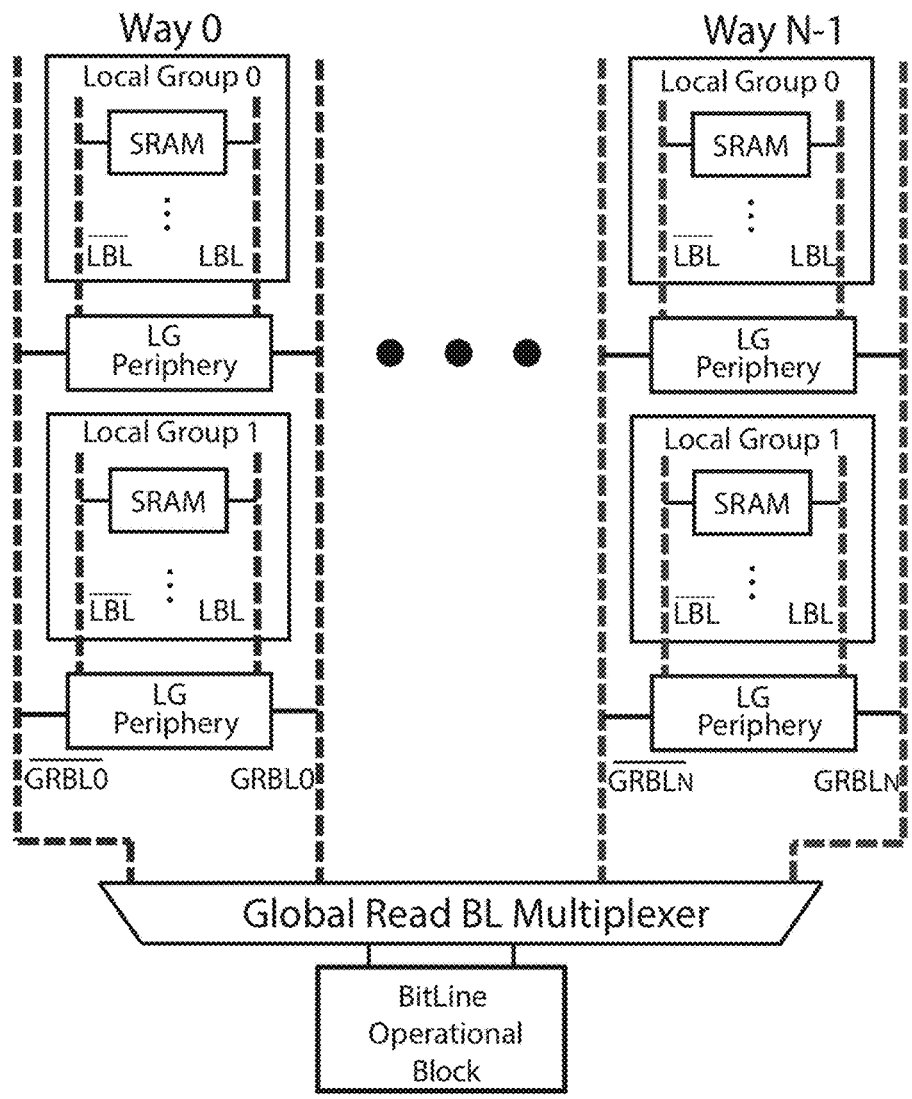
FIGS. 1A-1F show different aspects of bitline accelerators, with FIG. 1A showing an exemplary representation of the bitline accelerator for example for devices of the edge ("BLADE") memory organization, with a global read BL multiplexer for accessing a plurality N of memory ways.
Figure 1B:
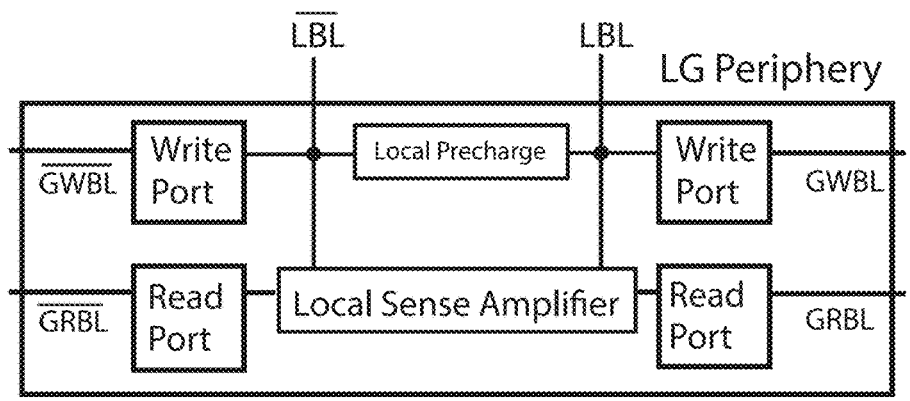
Figure 1C:
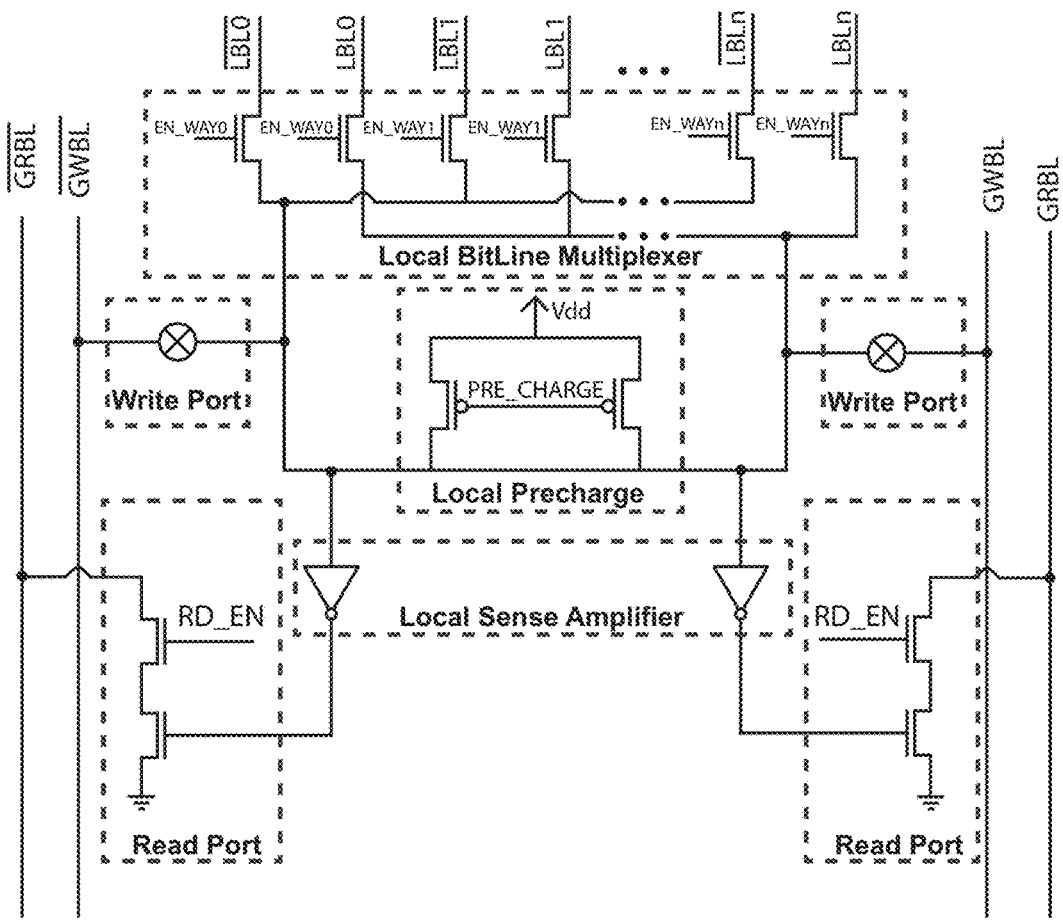
Figure 1D:
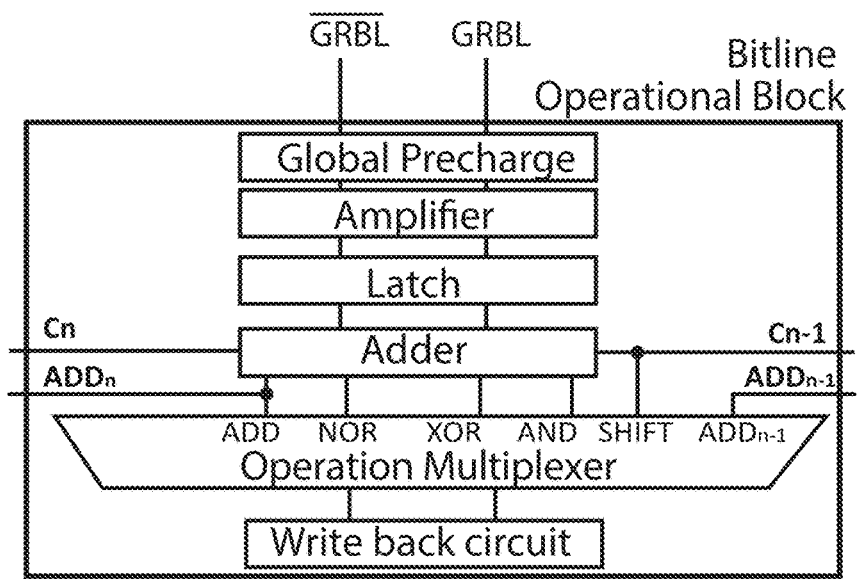
Figure 1E:
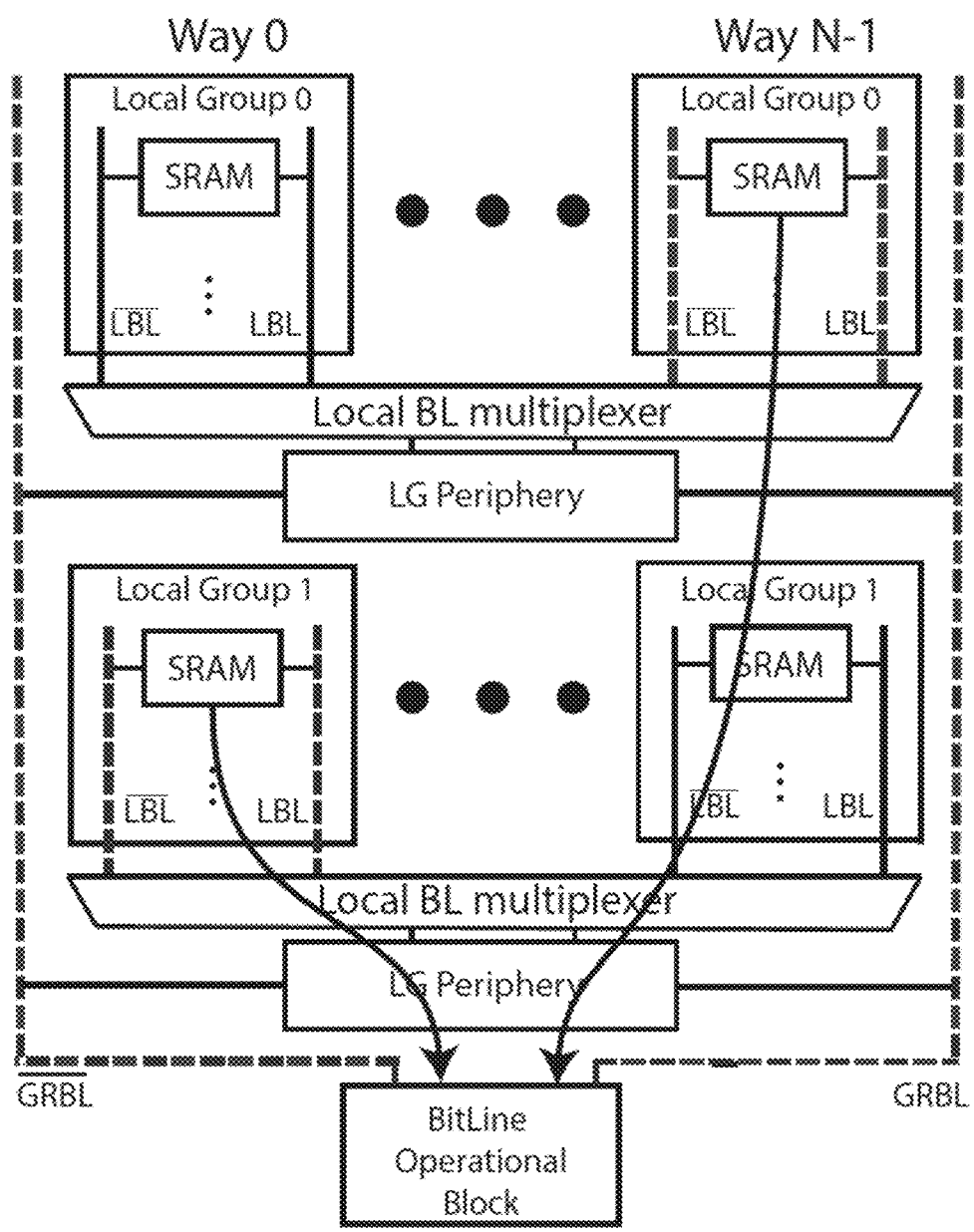
Figure 1F:
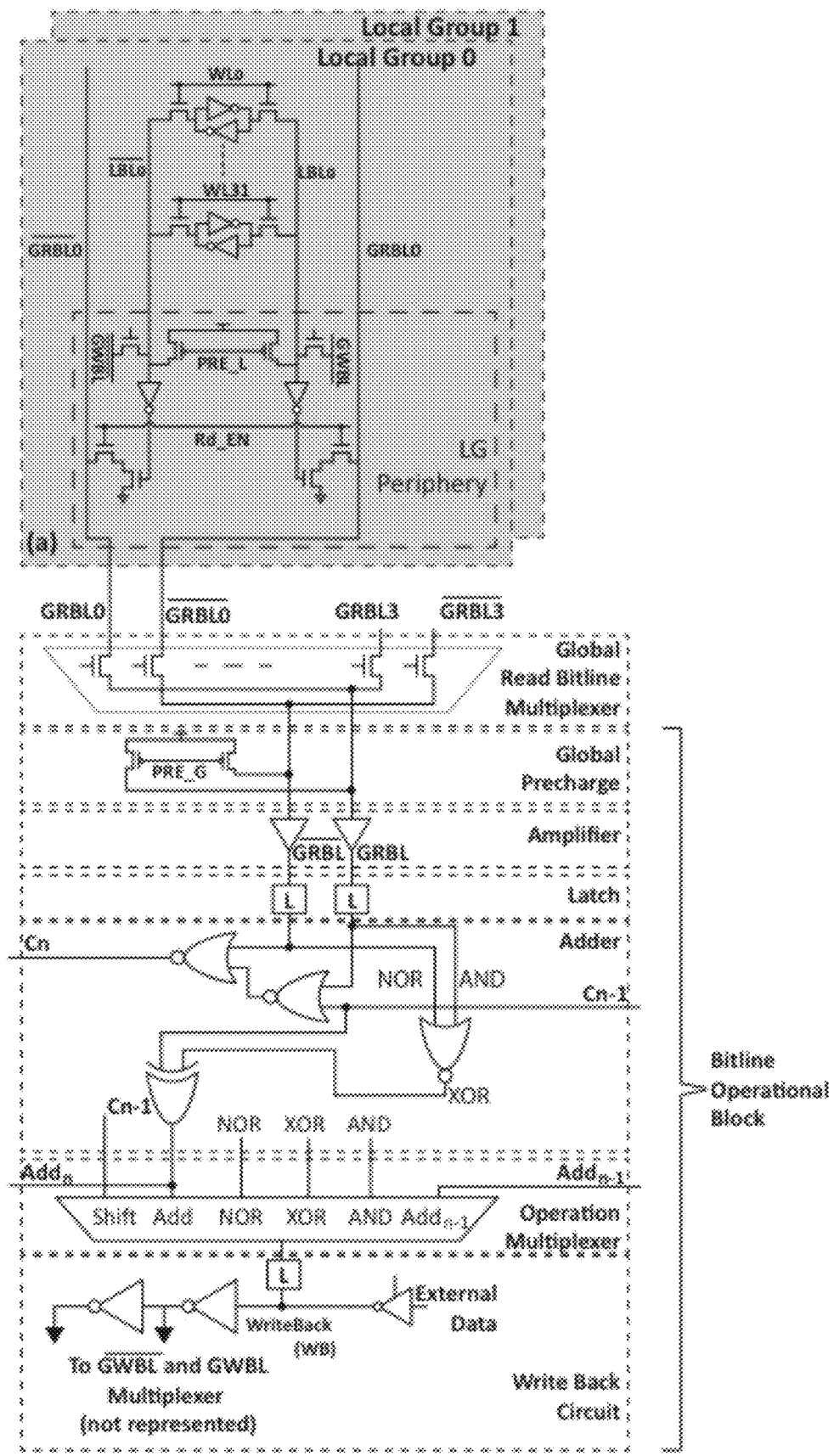

According to one aspect of the present invention, and as exemplarily illustrated FIGS. 1A, 1E and 1F, a random access memory (RAM) is provided. The proposed RAM includes a plurality of local memory group LG ways or columns, wherein each local memory group way or column includes a plurality of local memory groups LG, each local group LG including a memory column including a plurality of RAM memory cells, for example but not limited to SRAM memory cells, and a pair of local bitlines BL and $\overline{BL}$ operatively connected to the plurality of RAM memory cells, and a local group periphery that in turn includes a local bitline multiplexer operatively connected with the pairs of local bitlines BL and $\overline{BL}$ of the corresponding local memory group LG. In addition, each local memory group LG way or column includes a pair of global read bitlines GRBL and $\overline{GRBL}$ operatively connected to outputs of the plurality of local group peripheries. Furthermore, the random access memory also includes a global read bitline multiplexer GRBM operatively connected to outputs of the plurality of pairs of the global read bitlines GRBL and $\overline{GRBL}$ from the local memory group ways, and a bitline operational block BOB operatively connected an output of the global read bitline multiplexer GRBM. More details of the random access memory architecture are further explained below.

The random-access memory described herein, its elements, and its architecture can be implemented with different types of memory technologies and can be part of different types of memory systems. For example, the implementation of the architecture is possible with static random access memory (SRAM) cells, but it is also possible that the herein proposed memory architecture is implemented to different memory technologies for the cells, for example but not limited to resistive random access memory (RRAM), dynamic random access memory (DRAM), oxide-based memory, filamentary-based memory, conductive bridge-based memory, magnetic-based memory for example magneto-resistive random-access memory (MRAM), including but not limited to spin-orbit torque and spin-transfer torque, ferroelectric, phase change memory, and a combination thereof, for example for hybrid-memory types. Moreover, it is also possible that this memory architecture is used for charge trapping memories for example flash charge trapping memories, for example floating gate or oxide-nitride-oxide (ONO) memory. Moreover, the memory architecture can be implemented to different memory architecture and system environments, for example a regular microchip, integrated to a standard system memory hierarchy such as but not limited to cache memories for example for the in-cache computing, scratchpad memories or other types of memories that do not have a cache protocol, accelerator-centric memories that can be used in PCs, graphical processing units (GPUs) or as an accelerator, or for integration into a programmable logic device such as field programmable gate array (FPGA) devices and complex programmable logic devices (CPLD).

Moreover, according to another aspect of the present invention, with respect to the plurality of memory ways or columns, a corresponding local memory group LG that has a same index number n being associated to one of the plurality of memory ways or columns. The index number n refers to an indexing number that starts at one (1) and increases by one counting from a first memory group from one end of the local memory group arrays or rows to the other end of the local memory group arrays or rows. In addition, according to another aspect of the present invention, as exemplarily shown in FIG. 3, the local group periphery can include a pair of local amplifiers, for example a pair of local sense amplifiers SA having inputs that are connected to the local bitline multiplexer output, a pair of local read ports each associated to a corresponding one of the local sense amplifiers SA, and a pair of embedded shift circuits operatively connected to the pair of local read ports, respectively, outputs of the pair of shift circuits providing for an embedded shift number, operatively connected to a corresponding one of the pair of global read bitlines.

Next, to explain different aspects of the present invention and to give some more context, some definition and terminologies are explained. With respect to in-SRAM computing, conventional SRAM read operation pre-charges the BL pair (BL and $\overline{BL}$) and activates one word line WL, in such way that either the BL and $\overline{BL}$ discharge depending on the data stored in the bitcell. A sense amplifier then issues a logic value for the read operation. This standard SRAM operation can be exploited to perform what is called bitline computing, in which two WLs are accessed simultaneously. The resulting BL discharge results in a pair of logic operations between the bitcells of the activated WLs, namely AND and NOR. This basic in-SRAM Computing (iSC) logic can then be extended via a variety of methods. First, iSC architectures were demonstrated and tested, which was then further enhanced via the addition of an extra logic gate to support XOR operations. However, these works were based on 6T SRAM bitcells and suffer from data corruption, due to short circuiting between bitcells when multiple WLs are accessed. Consequently, performance and voltage scaling are limited to secure reliable operation. To perform iSC operations at ultra-low voltage, unconventional 4T bitcell design has been proposed, which suffers from instability and disturb risks. Neural Cache and DRC$^2$ architectures overcome data corruption using 8T and 10T SRAM bitcells, respectively, resulting in an area overhead of at least 30%.

As an intermediate solution, a bitline accelerator for devices of the edge (BLADE) memory architecture is proposed, using exemplary 6T SRAM bitcells and local bitlines. BLADE divides the memory array into LGs, each one includes its own local bitline, suppressing the risk of data corruption and enabling voltage scaling while maintaining a low area overhead. See for example the publications to Simon et al., "BLADE: A BitLine Accelerator for Devices on the Edge," Proceedings of the 2019 on Great Lakes Symposium on VLSI, pp. 207-212, year 2019, Simon et al., "A fast, reliable and wide-voltage-range in-memory computing architecture," IEEE 56th ACM/IEEE Design Automation Conference (DAC), pp. 1-6, 2019, and Simon et al., "BLADE: An in-Cache Computing Architecture for Edge Devices," IEEE Transactions on Computers 2020. See also U.S. patent application Ser. No. 16/866,566, now issued as U.S. Pat. No. 11,094,355, concurrently filed with the present application, these references herewith incorporated by reference in their entirety. For example, the BLADE memory architecture (i) does not require WL underdrive to mitigate data corruption risks due to its Local Group (LG) organization, it, and (ii) the use of LGs reduces array density by only 10% to 15%, making it more suitable than 8T-10T bitcells arrays.

A common limitation of iSC computing is data misalignment regarding the local BL multiplexer. In a cache, each multiplexed BL is named a way. To perform in situ operations, operands must be aligned along the ways, in other words share the same multiplexed BL as exemplarily shown FIG. 1A. This is known as operand locality. In this context, operations between misaligned data are not possible, leading to complex algorithm modifications and operand migration policies for iSC architectures. According to an aspect of the present invention, and as shown in FIGS. 1A and 1F, local BL multiplexers per LG periphery have been introduced that enable operations between misaligned operands, also called associativity agnostic operations, when in two different LGs. Also, the proposed memory architecture and method of operation stays compatible with parallel tag data access if included in a cache.

With respect to the BLADE memory architecture, this architecture includes an iSC architecture that is designed for low voltage edge devices. It performs bitline computing through an innovative memory array organization featuring local bitlines (LBLs). By ensuring that the operations are always performed between two different LGs, the risk of data corruption when accessing two WLs is eliminated. FIG. 1A exemplarily represents the BLADE memory architecture block schematic. The architecture includes a n-way cache structure (0 to n−1 local BL multiplexer), these n ways share the same BL logic through the Global Read BL (GRBL) multiplexer GRBM. Each way includes of two LG with their private LBLs and peripheral circuitry, being a Local Group Periphery (LGP). The LGP in turn, shown exemplarily in FIG. 1B, includes the local read and write ports, the pre-charge circuit, and two amplifiers, for example Local Sense Amplifiers (LSA), shown with more detail on a circuit level with FIG. 1C, as an exemplary implementation. The BLADE memory architecture computes GRBLs instead of the LBLs. During a read operation, the LBLs are connected to GRBLs through the Local Read Port (LRP). This solution prevents the LBLs to be coupled and short circuiting two bitcells. During a write operation, the write amplifiers are connected to the LBLs through Global Write BL (GWBL), not shown in FIG. 1A. The BLADE BL Logic contains a sense amplifier, a carry ripple adder, an operation multiplexer and a write back circuitry as shown FIG. 1D. It supports bitwise operations such as NOR, XOR and AND. With the addition of ADD and SHIFT, more complex operations can be performed, such as multiplication, subtraction and greater/less than.

An exemplary implementation of the bitline operational block BOB is shown in FIG. 1F in more detail, showing global read bitlines GRBL that are operatively connected to a GRBL multiplexer (GRBM), and outputs of the GRBM are connected to a precharge circuit and a pair of amplifiers, for example but not limited to sense amplifiers SA. Outputs of the pair of sense amplifiers SA are each connected to a latch L, and outputs of each latch L are connected to an operational circuit, for example an adder circuit, in the variant shown a carry ripple adder circuit, that is connected to an operation multiplexer, for example one with one or more logic operators, and outputs of the operation multiplexer are connected to a writeback circuit via a latch L. The herein described latches L could also be implemented as a flip flop, or other simple memorizing structure that can release and input value after a clock signal. The memory architecture shown in FIG. 1F exemplarily illustrates a four (4) way, 256×64 bitcell SRAM array with two local groups, each including 32 WLs. In order to support addition, the carry ripple adder is arranged underneath the array through the addition of two NOR gates and a XOR gate. Shift latches L are also implemented within the bitline operational block BOB to allow one cycle shifting. Each BL logic block receives a carry-in from the previous BL logic block, and provides a carry-out to the next block. FIG. 1F corresponds to FIG. 4 of the BLADE memory architecture, but with the additional of the latch L after the sense amplifiers SA, that allow to isolate the adder circuit, for example the carry ripple adder circuit, logic from the read and writeback stages.

Next, in-SRAM multiplication is explained, as well as the challenges thereof. Generally, performing iSC multiplication requires the use of complex operations such as SHIFT and ADD. To this end, previous iSC works have proposed the use of carry ripple adder to enable array level multiplications. For example, it has been proposed to optimize addition via a Manchester carry chain adder, see for example the herein incorporated BLADE memory architecture. However, among these works, multiplication itself is marginally studied and the effect of data structure are not discussed. Multiplication is an operation between the multiplicand A and multiplier B, with the product C achieved through the summation of partial products. Traditionally, these partial products are shifted values of A. Therefore, multiplication is achieved by shift-and-adding A, according to the bit values of B. When performed via iSC, each SHIFT or ADD operation requires two cycles, one to access the data and compute on the bitline, and one to Write Back (WB) the result to memory. Moreover, the total cycle count increases with the operand size. In order to simplify binary multiplication, the iSC multiplication shifts C instead of A. In each shift/add cycle, the controller inspects one bit bn in the multiplier B, from the most (MSB) to the least significant bit (LSB). First, C is left-shifted. Then if bn=12, A is accumulated into C.

Figure 9A:
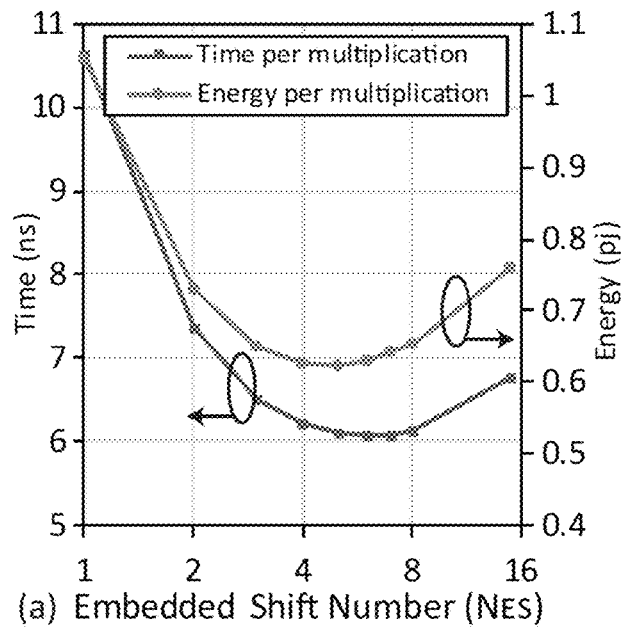
FIGS. 9A and 9B show two different graphs that represent time and energy and time multiplied by area and energy multiplied by area, performed under different values for embedded shift.
Figures 9B, 10:
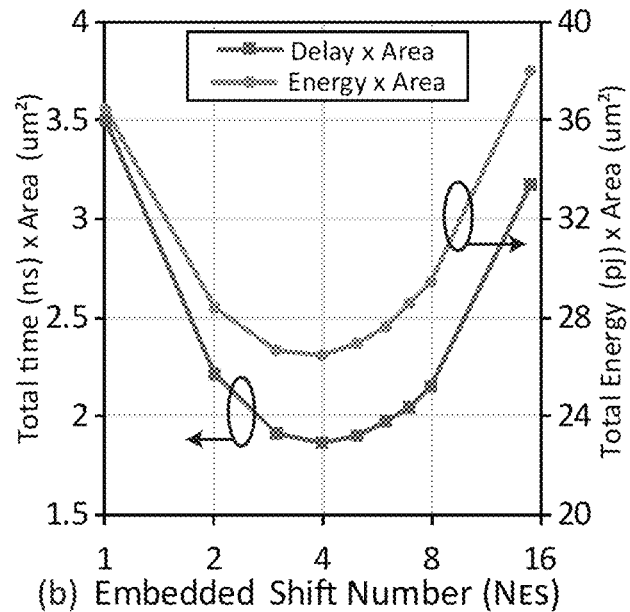
FIG. 10 shows a table with values of a comprehensive example of a multiplication between A=1010 and B=910 with detailed intermediate steps.
Figure 12:
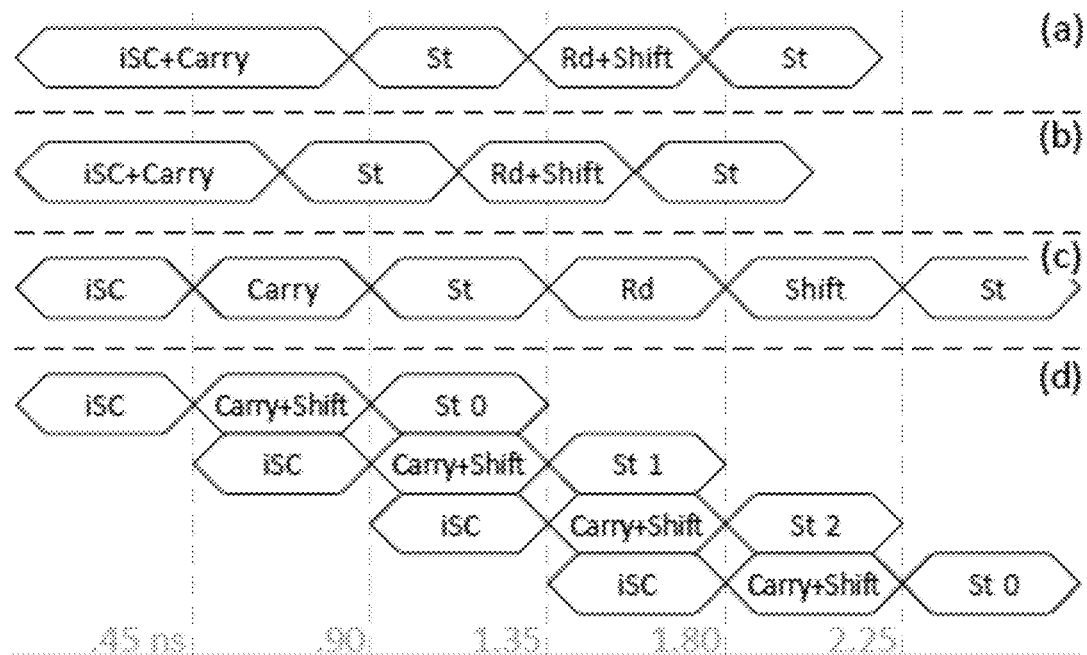
FIG. 12 shows exemplary timing signals for a multiplication cycle with (a) no optimization, (b) Manchester Carry Chain, (c) pipeline latches L, and (d) add-forward line.

The table shown in FIG. 10 demonstrates this technique via an example multiplication between the multiplicand (A=decimal (10)=binary (01010)) and the multiplier (B=decimal (9)=binary (01001)). The total number of operations for the given example is seven (7), with two (2) ADDs and five (5) SHIFTs, therefore resulting in a cycle count of fourteen (14).

Figure 2:
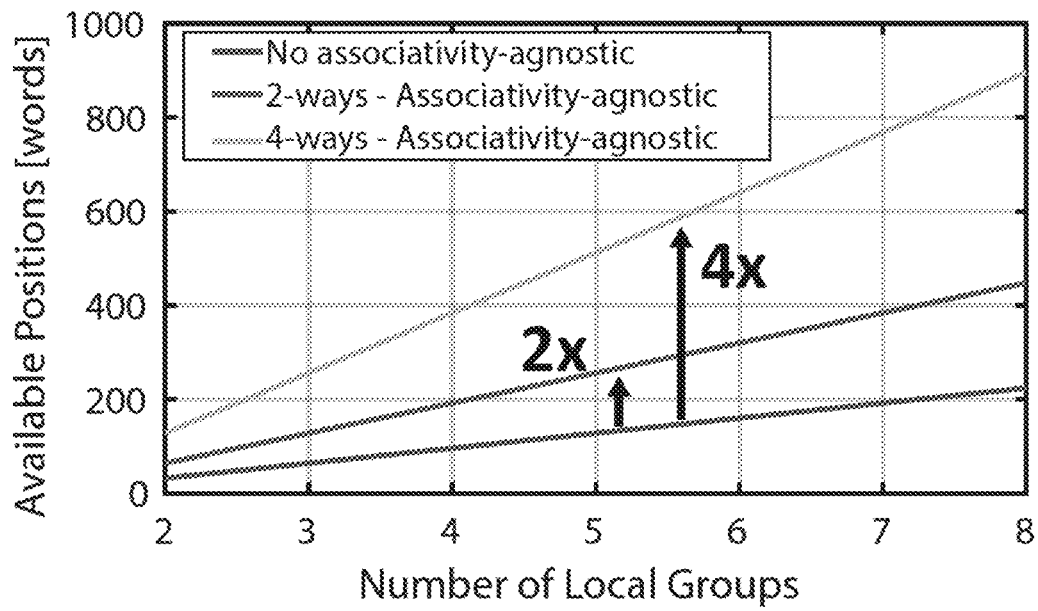
FIG. 2 shows an exemplary graph that represents available positions for operands, in the example misalignment mitigation, versus the number of local groups (LGs) for the proposed and baseline BL computing memories, according to another aspect of the present invention.

The proposed memory architecture, according to one aspect of the present invention, enable associativity-agnostic operations, and permit embedded shifts inside the local groups LGs, and it is also shown how such memory architecture can accelerate iSC multiplications. With respect to the associativity-agnostic local group LG, such associativity-agnostic operations simplify the controller at a system level, and mitigates one of the major drawbacks in iSC, namely, data misalignment. Considering four-ways, two (2) LG array with thirty-two (32) WLs per local group (LG), each operand has only thirty-two (32) potential available operands to which it can be multiplied with. It is noted that operands must occupy distinct LGs. By including local BL multiplexer inside each LG, available positions for operands increases by the local BL multiplexer width, for example four (4) times for a 4-way cache associativity. More positions can be made available by increasing the number of LGs as shown FIG. 2.

With the variant shown in FIGS. 1C and 1E, a local BL multiplexer is present for a same order local group LG of a plurality of memory ways, such that memory of a same order local group LG of a plurality of memory ways share the same LG periphery. Controlling independently each local BL multiplexer, two different ways can couple into the same GRBLs, as exemplarily shown in FIG. 1E with the two (2) arrows. This solution reduces the circuit complexity and improves the energy and area efficiency. By reducing the number of GRBLs and GWBLs by n x, the array controller is simplified and the energy efficiency is improved as less GRBL demand less energy during the pre-charge phase. Furthermore, the herein presented memory architecture greatly enhances the area efficiency. Whereas BLADE needs n LGP blocks per BL logic, with the present architecture only one (1) is employed. The BL logic area reduces 34% thanks to the read and write local BL multiplexers that are moved to the LGs.

Figure 3:
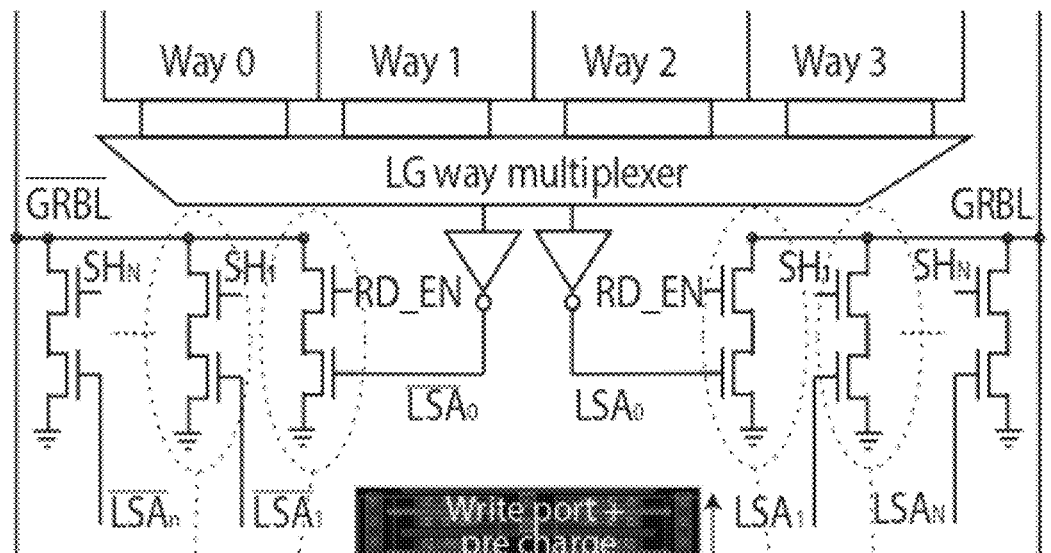
FIG. 3 shows an exemplary representation of a Local Read Port extended for N embedded shifts, according to an aspect of the present invention, with a corresponding exemplary circuit layout.
Figure 4:
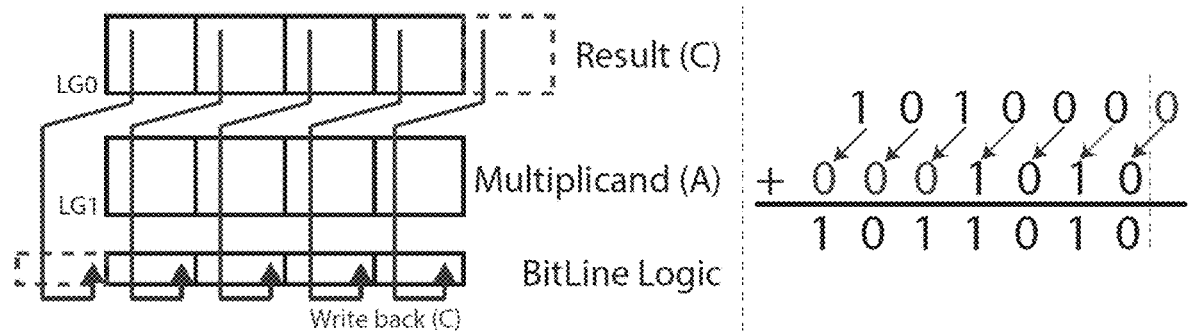
FIG. 4 shows a representation of a shifted addition path inside the memory array and the corresponding arithmetic representation.

Next, the efficient multiplication is that uses an embedded shift is explained with the exemplary embodiment of FIG. 3. Based on the use of local BL multiplexer, an embedded shifting circuitry can be integrated or otherwise part or associated of each local group LG. As exemplarily shown in FIG. 3, the output of the Local Sense Amplifiers (LSA) are connected to a neighbour Local Read Port (LRP), in other words to the neighbour GRBL. In this context, from the BL logic point of view, the data is shifted. During an iSC operation between two operands, this feature enables direct shifting of one of the operands without requiring any preliminary SHIFT+WB cycle. With the present memory architecture, these proposed modifications are included to an LG. This additional circuitry incurs a small area cost, with each embedded shift increasing the LG layout length by 0.39 μm when pitched on 2 μm, with a four (4) bitcells width. The table of FIG. 11 shows the chain of operations that have to be executed for a number NES of embedded shifts going from 0 to 4. Column with the value NES=0 has no shift logic, and therefore the SHIFT operation count equals the size of the operands, while the number of ADDs to be performed equals the count of '1's in the multiplier. For NES=1, ADD and SHIFT can be performed in one cycle by shifting the result inside the LG before performing an iSC operation with the multiplicand, as illustrated in FIG. 4. Thus, NES=1 reduces the operation count to just the number of bits in the operand, matching the performance of BLADE while simplifying the bitline operational block BOB.

It is possible to extend NES to greater values, enabling operands to be shifted by more than one bit at a time. Such an architecture can be used to accelerate multiplication by analysing the bit pattern of the multiplicand. Specifically, bit patterns with leading 0s can be accelerated. For example, for NES=2, whenever the iSC controller detects a 02 in the most significant bit, a two (2) bit shift can be performed as opposed to one (1). The two new available operations are:

$$B_n=00 \rightarrow 2\times\text{Shift}(C)+WB(C). \quad 1)$$

$$B_n=01 \rightarrow 2\times\text{Shift}(C)+\text{Add}(C,A)+WB(C). \quad 2)$$

For $N_{ES}=3$, the patterns that are accelerated are:

$$B_n=000 \rightarrow 3\times\text{Shift}(C)+WB(C). \quad 1)$$

$$B_n=001 \rightarrow 3\times\text{Shift}(C)+\text{Add}(C,A)+WB(C). \quad 2)$$

So, for each local group (LG) shifting, the number of concatenated SHIFTs that is performed simultaneously increases. But as these occurrences are statistically less common, the gain saturates. For the given example, the operations executed for $N_{ES}=2$ and 3 are 3 and 2, respectively. Representing 71% cycles count reduction in comparison with no embedded shift.

With respect to the multiplication controller, to perform data dependent operations, a dedicated control logic block is included to the memory architecture, for performing multiplications. For example, the BLADE memory architecture integrates an ADDn−1 between BL operational blocks (in the variant shown the adder, for example a the carry ripple adder) in the operation multiplexer, as illustrated in FIG. 1F. This accelerates the multiplication by allowing addition results to be shifted during write back, thus only requiring two cycles per bit in the operand to complete a multiplication. According to one aspect of the present invention, a logic controller is proposed, for example but not limited to multiplication controller that can be included inside the subarray controller CTRL, as shown with respect to FIGS. 13A and 13B.

Figure 5A:
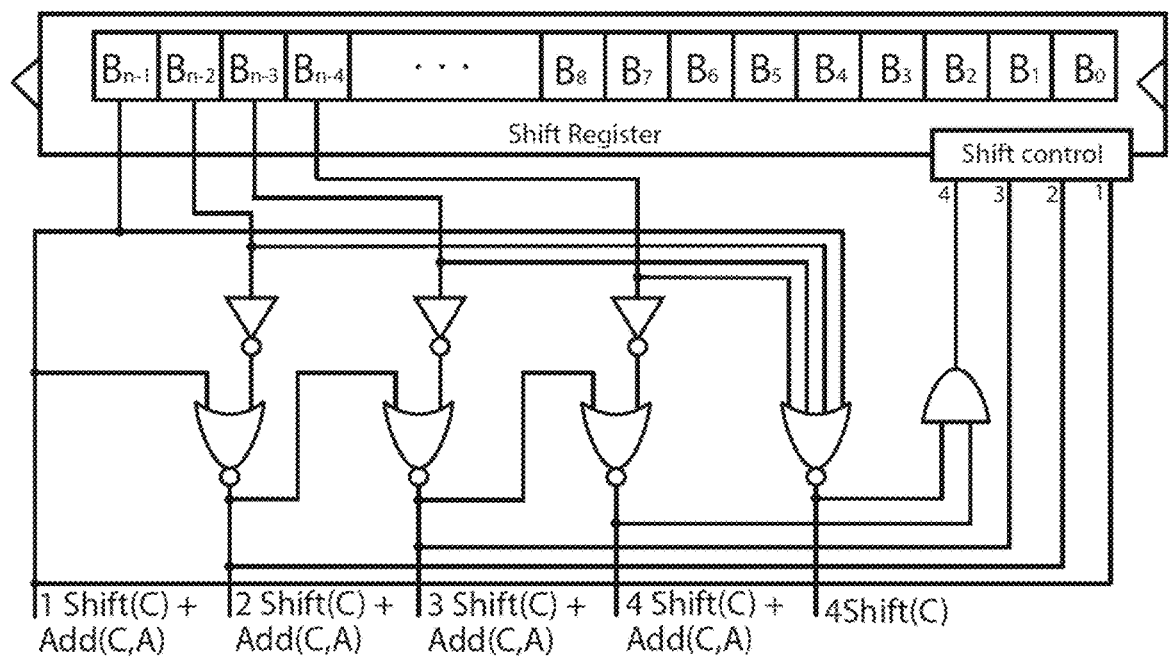
FIGS. 5A, 5B, and 5C show exemplary multiplication controllers that can be part of the subarray controller CTRL
Figure 5B:
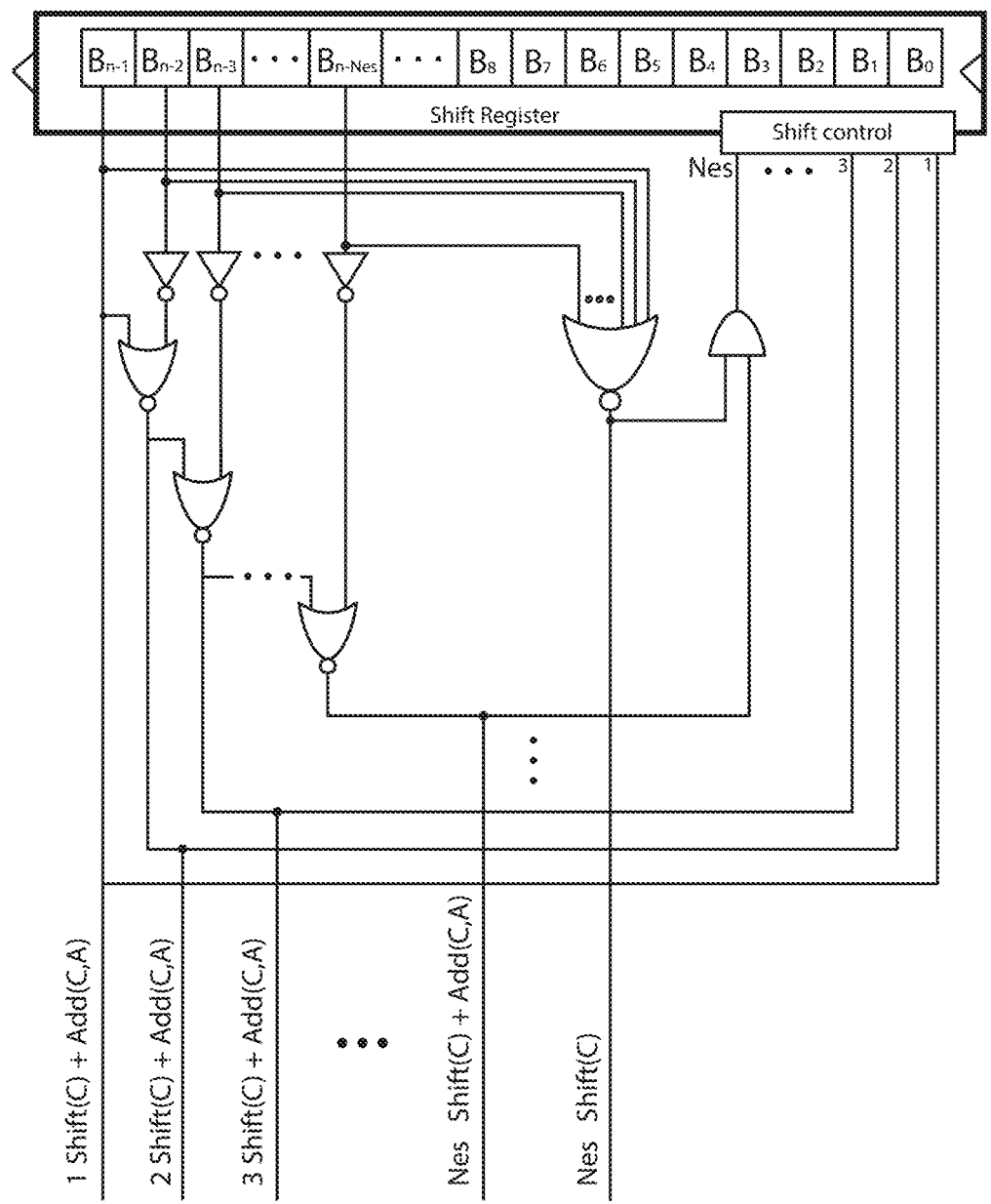
Figure 5C:
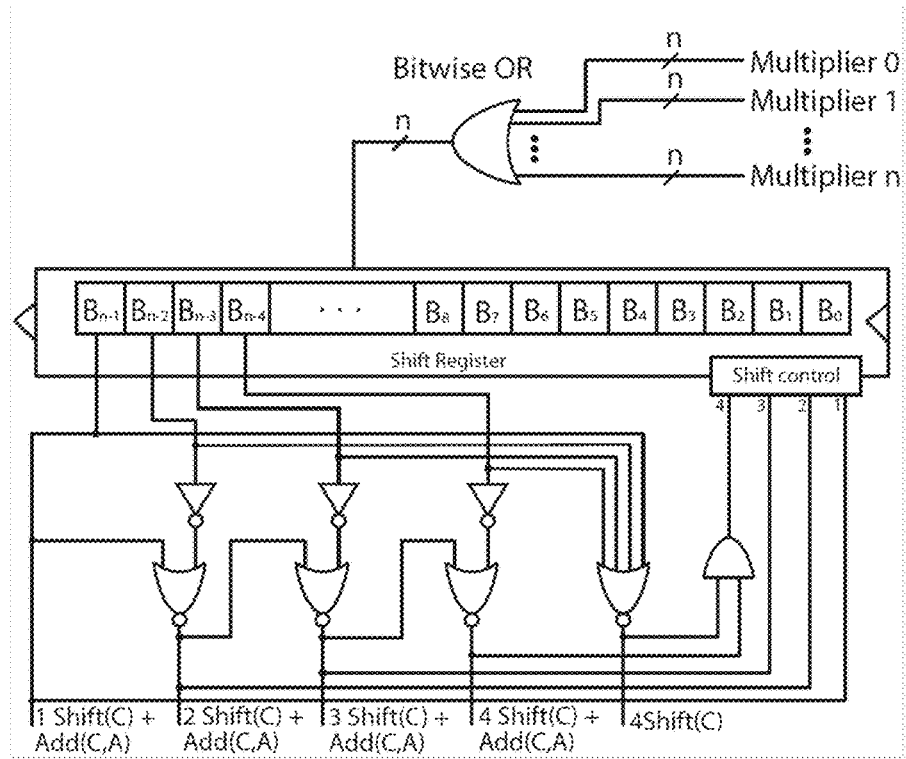
Figure 5D:
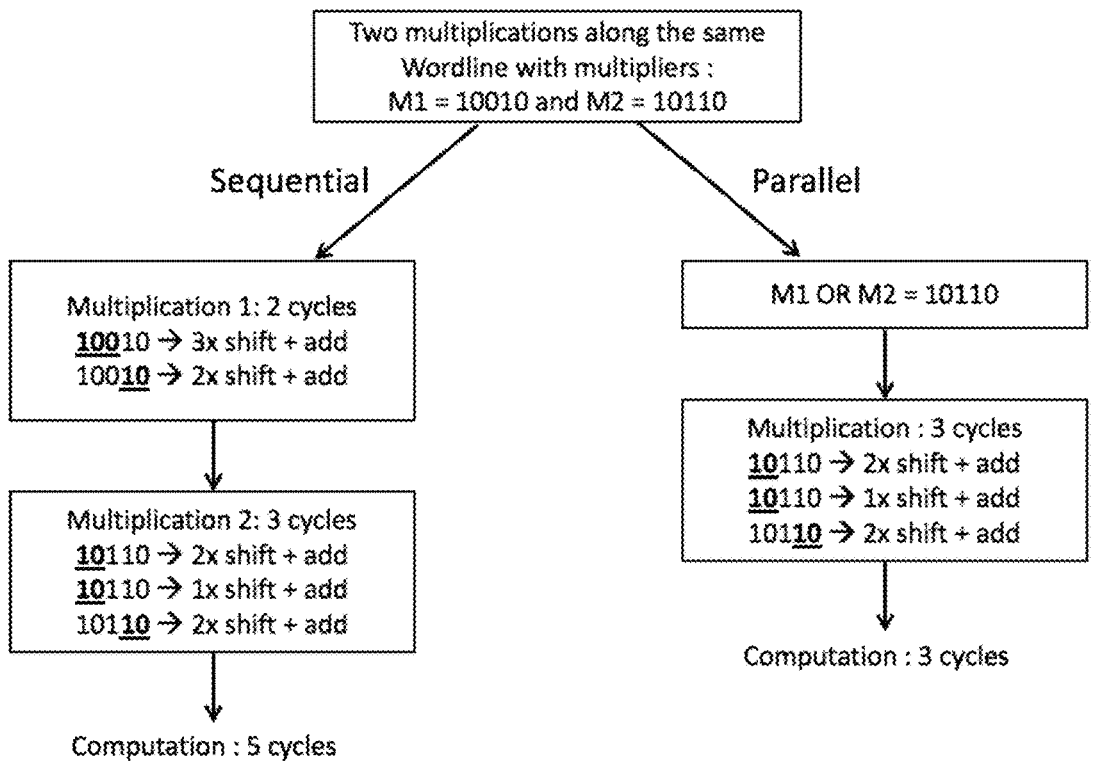
FIG. 5D shows an exemplary flow chart for optimizing more than one multiplication along the same word line WL of a subarray, with FIG. 5A showing an exemplary NES=four (4) bits multiplication controller block schematic for n-bits word as a dedicated control logic block, FIG. 5B showing a multiplication controller for any NES number, and FIG. 5C showing a multiplication circuit for more than one multiplication that can be performed within the subarray controller CRTL, according to still another aspect of the present invention.
Figure 13A:
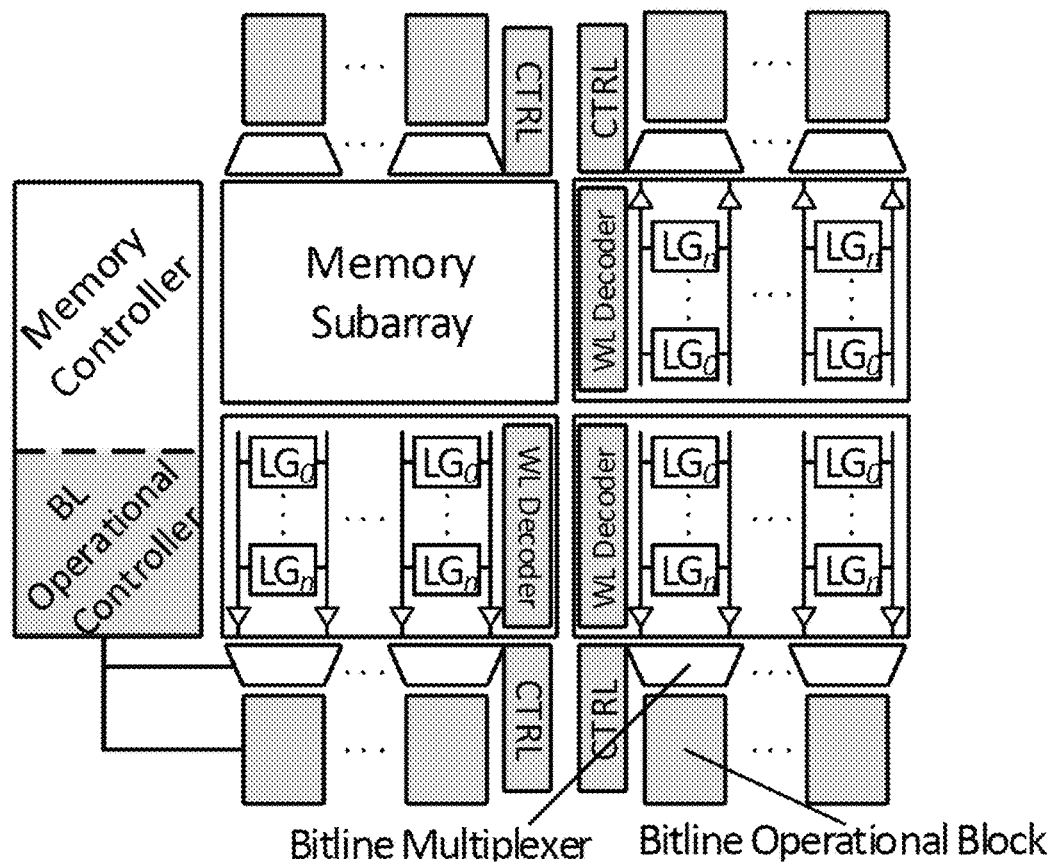
FIGS. 13A and 13B show simplified schematic views of an exemplary implementation of the memory architecture to a cache memory, where the highlighted boxes are representing additions to an existing cache architecture, showing the bitline operational blocks BOB, subarray controllers CTRL, and the WL decoders, with FIG. 13A showing a general overview of the architecture, and FIG. 13B showing details of the interconnection between the WL decoder, the subarray controller CTRL, and the bitline operational block BOB, whereas the CTRL has a multiplication controller embedded therein.
Figure 13B:
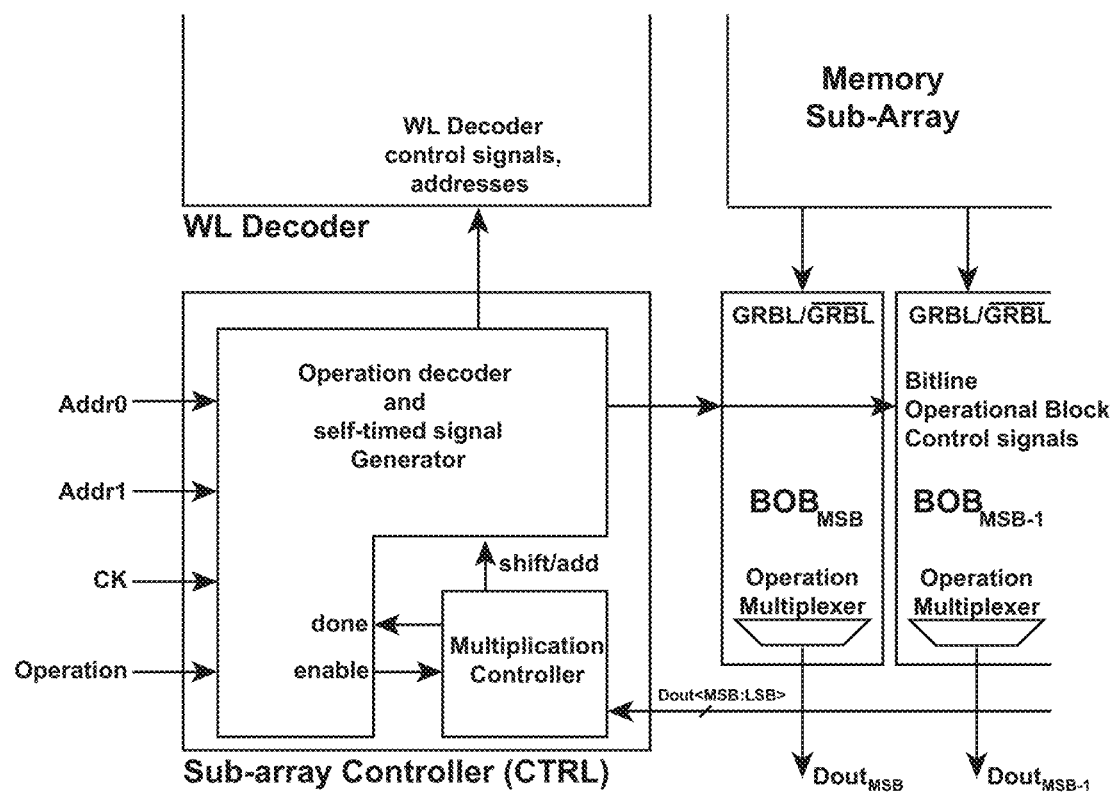

FIG. 5A exemplarily presents a multiplication controller for the block schematic of a NES=4 control logic block that can be used for a n-bits word size, and FIG. 5B showing an exemplary implementation of the multiplication controller as a control logic for any number of shifts NES, this multiplication controller arranged inside the subarray controller CTRL as shown exemplarily in FIG. 13A, with their operative interconnection of the subarray controller CTRL to the world line WL decoder, shown in FIG. 13B. More details on an exemplary WL decoder are shown in FIG. 3 of the herein incorporated BLADE patent. The control logic block of the multiplication controller can be a circuit that includes a shift register and logic gates. Before any multiplication, one of the operands, ideally the one containing the least '1's, is stored inside the shift register. Then, at each cycle of the multiplication, depending on the MSBs (4 last bits in the case of a NES=4 controller), the operation to be performed is calculated and processed as iSC operations in the memory. Then, before the next multiplication cycle, the register is shifted depending on the word structure. As an example, as shown in the example of FIG. 5A, if B15, B14, B13, B12=00002, the issued operations are four (4) shifts and then B stored in the shift register is shifted four (4) times. It is noted that only one multiplication per subarray is assumed. In a variant as shown exemplarily in FIG. 5C, more than one multiplication can be performed on data from the respective local group LG, and an exemplary flowchart of the operation thereof is shown in FIG. 5D.

FIGS. 13A and 13B shows the overall memory architecture where the memory space is organized into different memory subarrays, in the exemplary variant shown four (4) different subarrays, each subarray having plurality of local group LG memory ways or columns, with a global read bitline multiplexer GRBM and bitline operation block BOB associated to each way or column, and each memory subarray having a WL decoder, and a subarray controller CTRL associated thereto. The multiplication controllers shown in FIGS. 5A to 5C are part of, or operatively associated with the subarray controller CTRL, and includes also all the other circuitry for generating the timing signals and other signals for operation of the memory subarray. In this respect, the multiplication controller is added to provide for one optimized operation per memory subarray, and can received data from the multiplier of the BOB. For example, each operational multiplexer of a corresponding BOB of neighboring memories can provide for data that can be outputted from the memory architecture as Dout, or can be used as an input of a word that is further subject to multiplication by the multiplication controller inside the CTRL, for example by the multiplication circuits that are schematically shown in FIGS. 5A-5C. It is possible to add a data quantization to ensure that all the data that enters the multiplication controller have the same data structure, which can allow for several parallel multiplications per subarray.

Experimental results have been done and show substantially improved performance over the state of the art. To validate the proposed memory architecture electrically, and assess its performance, energy consumption and area efficiency, a 256_64 (32WL per LG) SRAM array was implemented using an exemplary 28 nm CMOS bulk technology process design kit (PDK) from TSMC, simulated at 1V. A design methodology that is equivalent to the one described in reference [6] was used, and the critical paths with equivalent parasitics and gates were simulated to optimize the design and simulation time. In order to compare the proposed circuit optimizations to BLADE, a layout of the LG was used as exemplarily shown in FIG. 3.

Figure 6:
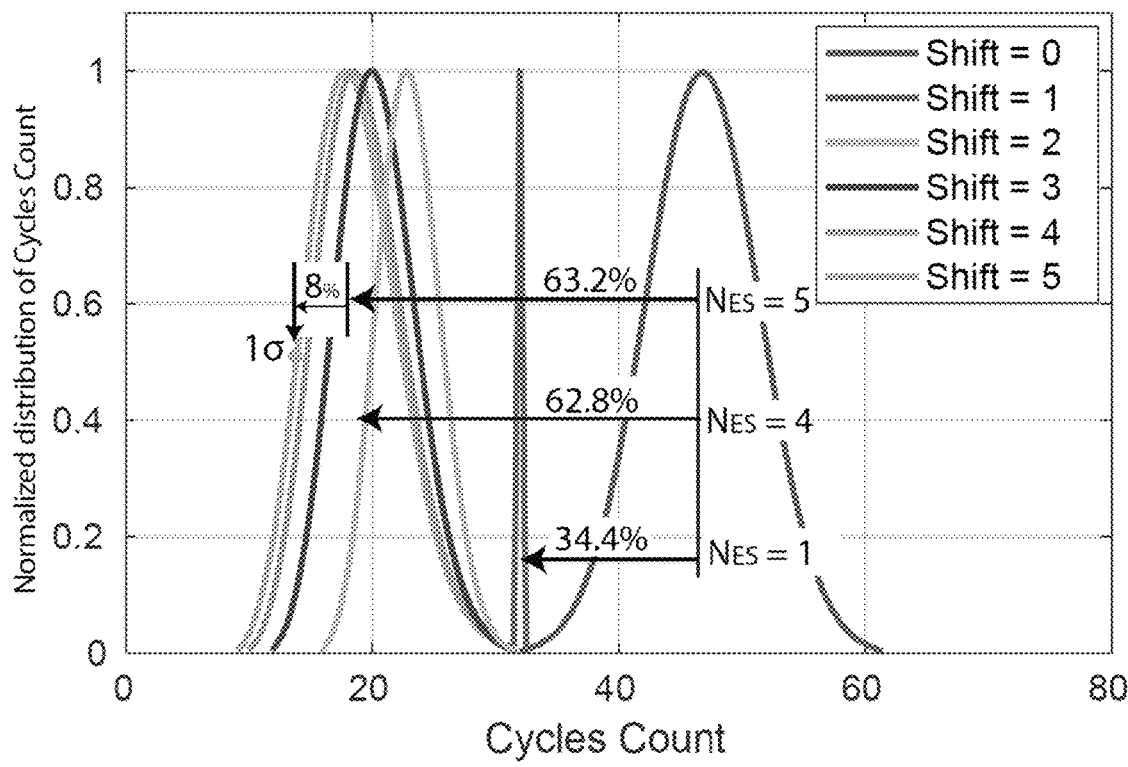
FIG. 6 shows a graph that represents a cycle count distribution of 16 bits multiplications.

With respect to the behavioural model, to evaluate the performances of the proposed multiplication controller of the memory architecture, an analytical behavioural model of the memory and multiplication controller was designed. For a given set of parameters with the number of shifts NES, word length, and multiplier value, the model calculates the amount of cycles required to perform the multiplication. We then extract statistical data considering all the possible values, for example from 0 to 216−1 for 16 bits operands, to assess the cycles count distribution. The normalized representation is shown in FIG. 6.

For NES=0, each bit, if it is a '1', it takes 4 cycles (SHIFT, WB, ADD, WB) while if it is a '0', it only takes 2 (SHIFT, WB). In the end, the distribution spans from 32 to 64 cycles.

For NES=1, the number of operations is equal to the size of the operand, regardless of the data structure, thus the distribution is concentrated in 32 cycles.

For NES>2, the right tail of the distribution always equals 32 cycles, representing the worst case of multiplier (B=216−1) when all bits are 1. The average, however, decreases accordingly to higher values of embedded shift. For each successive embedded shift, the accelerated patterns become rarer, lessening the potential gain. The difference between the average cycles count for NES=4 and NES=5 is less than half cycle. While the average gain for NES>2 exceeds 60%, it must be noted that the computation time is highly data dependent.

For a neural network execution, forcing the weights to respect a given sparsity may enable additional gains with reduced performances drop. As a reference, for NES=5, considering a data structure where the accumulated cycle count of several multiplications shifts from the average to one sigma left, it represents an extra gain of 8%.

Figure 7:
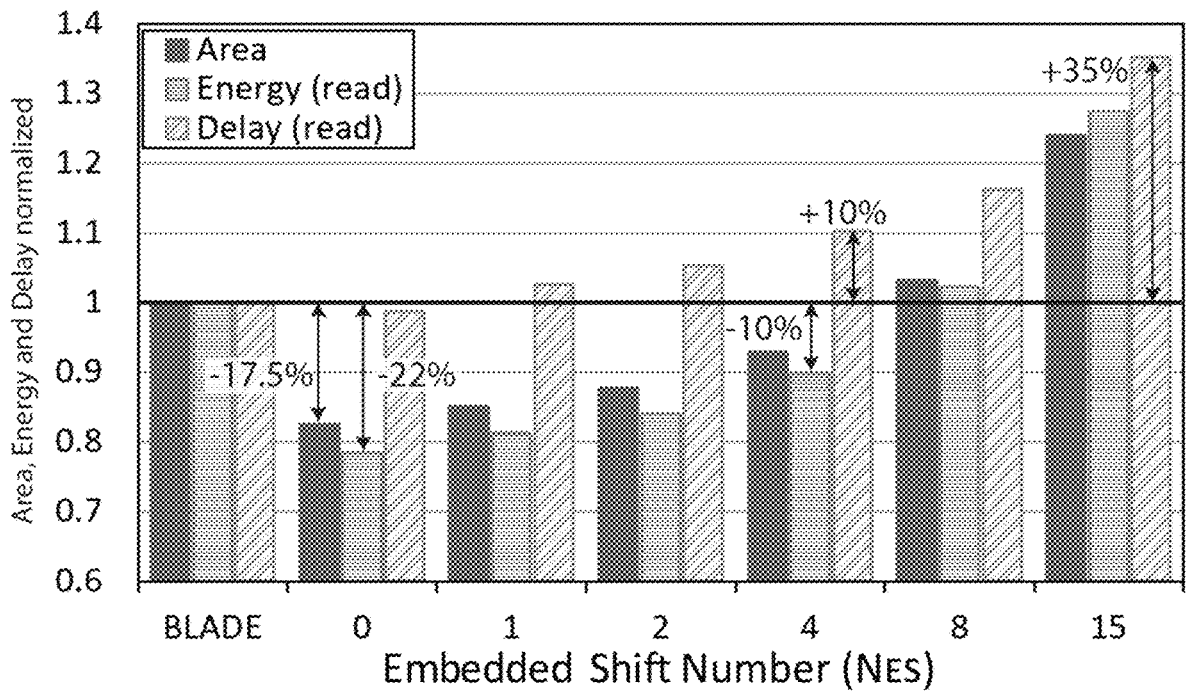
FIG. 7 shows graphs that represent area overhead, read delay and energy evolution of the proposed associativity-agnostic memory organization as compared to and normalized to BLADE, with lower values indicated the better values.

With respect to the performance results, the proposed memory architecture has been analysed at both circuit and system level, to get an idea of its performance and application, and have identified the optimal working and configuration conditions. With respect to electrical characterization and area estimations, FIG. 7 shows the specifications (area, delay, energy) of the proposed memory architecture compared to BLADE. By attaching more transistors in the LRP, the overall parasitic capacitance of the GRBL and of the LSA output increases, rising the energy consumption and reducing the performances. Thanks to the GRBL optimization enabled by the use of local BL multiplexer, this effect is compensated. Finally, for NES=0, the energy is reduced by 22% for one operation. Beyond NES=7, the energy consumption is not as good at the performance of the BLADE architecture, as the energy consumption is higher. Concerning the read delay, for NES=0, the delay is similar to BLADE, less than 2% reduction. For higher values of NES, however, the value surpass BLADE because the path covered by the signal is longer, each embedded shift increases in 2 μm the signal propagation distance. The increasing the LSA drive may mitigate this effect while increasing the LG area. The read delay is 10% higher for NES=4 and it exceeds 35% for NES>15. Finally, the corresponding area from the layout of the proposed memory architecture is determined, as shown FIG. 3, and a 17% density improvement for NES=0 has been shown. It must be noted that the area of the proposed memory architecture becomes larger than BLADE for NES>7.

Figure 8:
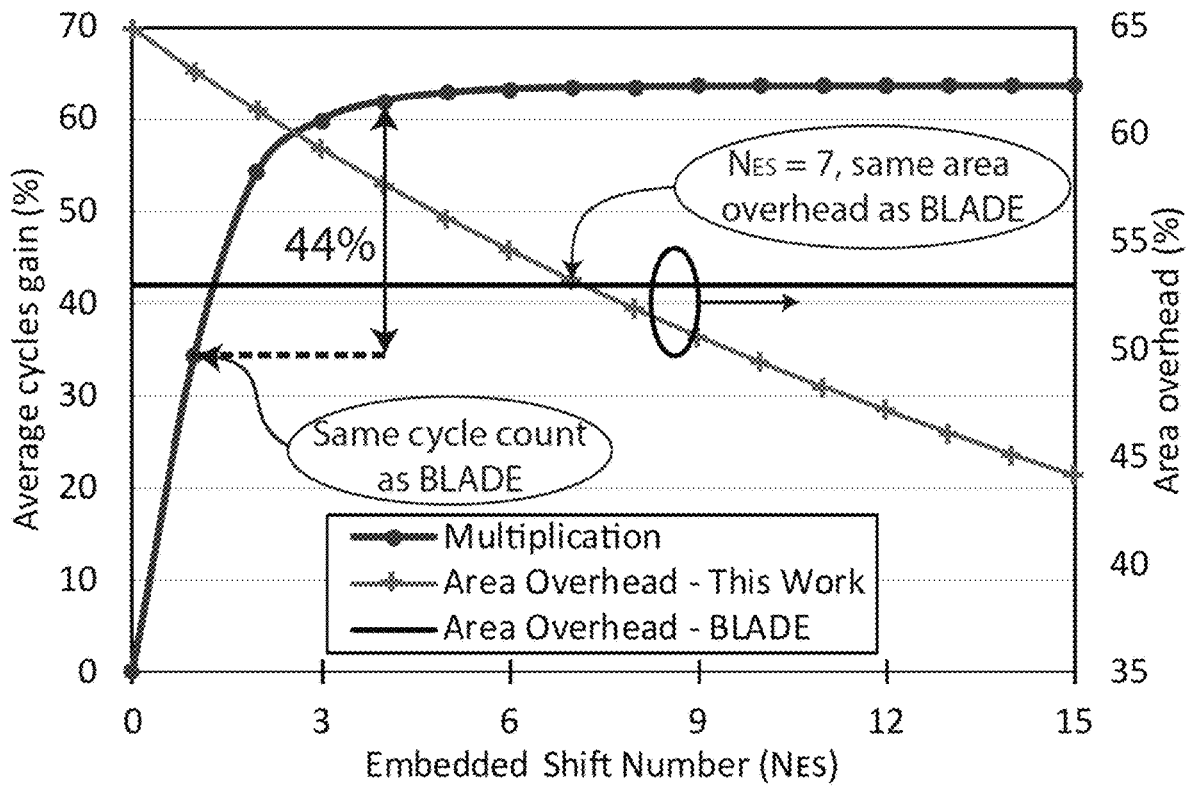
FIG. 8 shows a graph that represents cycle gain and area overhead per embedded shift.

With respect to the assessment on the system level, FIG. 8 shows the average cycles gain and area overhead as a function of the embedded shift number. For the same multiplication performance as BLADE, (NES=1), a 9% area overhead reduction has been demonstrated. On the other hand, FIG. 8 also showcase a gain saturation that can be explained by the fact that after a point, more embedded shifts only accelerate a marginal portion of the words possibilities, i.e., saturating the average gain. Compared to BLADE, a 44% cycle count reduction has been demonstrated.

Overall, several non-aligned trends can be shown: (i) the average multiplication performances gain (i.e., cycle count) tends to saturate with an increased number for NES, (ii) The area overhead and energy are beneficial for a low number NES of embedded shifts, at NES<7, but becomes disadvantageous beyond that number. (iii) The operation delay degrades with the number NES of embedded shifts. FIG. 9A exemplarily shows the time spent in ns with the lower curve and the energy consumed in pJ with the upper to perform a complete 16 bits multiplication (considering ADD, SHIFT and WB time and energy). The optimum values for energy and time are NES=5 and NES=7, respectively. On the other hand, as exemplarily shown FIG. 9B, when including area considerations (i.e., multiplying the time and energy by the total memory area), we show a Time_Area and Energy_Area optimum for NES=4. Compared to BLADE, a NES=4 enables 47% and 41% of average performance gain for energy and delay, respectively. Moreover, the area overhead is reduced by 4%.

According to another aspect of the present invention, an arithmetic operation pipelining is presented in conjunction with the memory architecture described herein. For example, add and shift multiplication can seriously mitigate performance if not properly implemented to the memory architecture. In order to improve operation throughput, three optimizations have been implemented that allow multiplication pipelining. First, latches L are arranged after the sense amplifiers Sa, as shown in FIG. 1F. Without latches L, the iSC and ripple carry operation must be completed in a single step before writeback can be performed. Latches L can isolate the carry logic from the read and writeback stages, enabling these stages to be pipelined, as illustrated in with the timing signal (c) of FIG. 7. Moreover, an add-forward line is implemented that is connecting an output of the adder circuit of one local group LG to an input of adder of a neighbouring local group LG, to the writeback stage of the next bitline BL pair, allowing a combined add and shift operation. Moreover, the memory architecture can perform a writeback and iSC operation simultaneously, if the writeback target block is in a different LG than those accessed for iSC. By first accumulating the product in three partial sums, then summing these partial values, it is possible to fully pipeline the iSC, carry, and writeback stages of multiplication, as illustrated with the timing signal (d) of FIG. 7. This strategy constrains the cache geometry to at least four LGs per subarray, one containing the multiplicand, which is accessed every cycle, and three containing the partial products.

To summarize, according to some aspects of the present invention, an enhanced or improved BLADE architecture is proposed, and a method of operating the same, to enable associativity-agnostic operations as well as highly efficient multiplication operations. A non-exclusive list of the advantages and improvements of the proposed memory architecture, that is based on the BLADE architecture can be summarized as follows:

A local BL multiplexer is implemented inside the LG, as opposed to global multiplexer inside the BL logic, enabling area and energy gain at constant performances and enabling associativity-agnostic operations between misaligned data.

Moreover, the shift logic is located inside the LGs for embedded shifting providing for the area and energy gains of the proposed modifications, which 17.5% and 22% respectively, through parasitic aware electrical simulations and layout using the exemplary 28 nm bulk CMOS TSMC technology PDK.

Furthermore, a novel multiplication controller and scheme is proposed and analysed with an analytical behavioural model to demonstrate performance under various configurations of the proposed embedded shift logic. The results are 44% cycle count, 47% energy, and 41% performances gain for sixteen (16) bit multiplication compared to the conventional BLADE architecture. See references [5] and [6]. In addition, the design space of the proposed optimization has been explored and it has been demonstrated that a four (4) bit embedded shift architecture provides optimal trade-off between performance, energy consumption and area overhead when performing in-memory multiplication.

In sum, according to some aspects of the present invention, with the features of the herein presented memory architecture it is possible to substantially improve the previously proposed bitline accelerator for devices of the edge (BLADE) architectures for in-cache or in-memory computing to efficiently support multiplication operations by enhancing the local bitline circuitry, enabling associativity-agnostic operations, as well as in-place shifting inside local groups periphery. The proposed memory architecture and method of using the same has been simulated and implemented in an exemplary CMOS 28 nm bulk technology from TSMC, validating its functionality and extracting its performance, area, and energy per operation. Moreover, a behavioural model of the proposed architecture and method has been designed to assess its performance with respect to the latest BLADE architecture. The results show a 17.5% and 22% area and energy reduction based on the proposed local group (LG) optimization. Finally, for 16 bits multiplication, a 44% cycle count, 47% energy, and 41% performance gain has been demonstrated in comparison to the state-of-the-art BLADE architecture, and show that four (4) embedded shifts is the best trade-off between energy, area and performances.

While the invention has been disclosed with reference to certain preferred embodiments, numerous modifications, alterations, and changes to the described embodiments are possible without departing from the sphere and scope of the invention, as defined in the appended claims and their equivalents thereof. Accordingly, it is intended that the invention not be limited to the described embodiments, but that it have the full scope defined by the language of the following claims.

REFERENCES

[1] B. Reese. Ai at the edge: A gigaom research byte. GigaOm, 2019.
[2] A. Haj-Ali, R. Ben-Hur, N. Wald, and S. Kvatinsky. Efficient algorithms for in-memory fixed point multiplication using magic. In 2018 IEEE International Symposium on Circuits and Systems (ISCAS), 2018.
[3] K.-C. Akyel et al. DRC2: Dynamically reconfigurable computing circuit based on memory architecture. In IEEE ICRC, 2016.
[4] C. Eckert et al. Neural cache: Bit-serial in-cache acceleration of deep neural networks. CoRR, 2018.
[5] A.-W. Simon et al. Blade: Bitline accelerator for devices of the edge. ACM GLSVLSI, 2019.
[6] A.-W. Simon et al. A fast, reliable and wide-voltage-range in-memory computing architecture. IEEE/ACM DAC, 2019.
[7] S. Aga et al. Compute caches. In HPCA, 2017.
[8] S. Jeloka et al. A 28 nm configurable memory (TCAM/BCAM/SRAM) using push-rule 6t bit cell enabling logic-in-memory. IEEE JSSC, 2016.
[9] M. Chang et al. Hardware accelerator for boosting convolution computation in image classification applications. In 2017 IEEE 6th Global Conference on Consumer Electronics (GCCE), 2017.
[10] A. Agrawal et al. X-sram: Enabling in-memory boolean computations in cmos static random access memories. Trans. Circuits Syst. I, 2018.
[11] M. Kooli et al. Smart instruction codes for in-memory computing architectures compatible with standard sram interfaces. IEEE/ACM DATE, 2018.
[12] Qing Dong et al. A 0.3 v vddmin 4+2t sram for searching and inmemory computing using 55 nm ddc technology. In 2017 Symp. On VLSI Circ. IEEE, 2017.
[13] L. Chang et al. A 5.3 ghz 8t-sram with operation down to 0.41 v in 65 nm CMOS. In VLSI Symp., 2007.

The invention claimed is:

1. A random access memory array comprising:
a plurality of local memory group ways, each local memory group way including,
a plurality of local memory groups, each local memory group including,
a memory column including a plurality of memory cells,
a pair of local bitlines operatively connected to the plurality of memory cells, and
a local group periphery including a local bitline multiplexer operatively connected with the pair of local bitlines of the corresponding local memory group; and
a pair of global read bitlines operatively connected to outputs of the plurality of local group peripheries;
a global read bitline multiplexer operatively connected to outputs of the plurality of pairs of the global read bitlines from the local memory group ways; and
a bitline operational block operatively connected to an output of the global read bitline multiplexer, the bitline operational block configured to perform at least one of a logic or arithmetic operation.

2. The random access memory of claim 1, wherein the local group periphery comprises:
a pair of local amplifiers having inputs that are connected to outputs of the local bitline multiplexer;
a pair of local read ports each associated with a corresponding one of the local amplifiers; and
a pair of embedded shift circuits operatively connected to the pair of local read ports, respectively, outputs of the pair of shift circuits providing for an embedded shift number, operatively connected to a corresponding one of the pair of global read bitlines.

3. The random access memory of claim 1, wherein the local bitline multiplexer is configured to connect a selected pair of local bitlines of a corresponding local memory group to inputs of a pair of amplifiers of the local group periphery.

4. The random access memory of claim 2, further comprising:
a local control logic block for controlling the pair of embedded shift circuits, such that a register of a corresponding one of the embedded shift circuit is shifted depending on a word structure.

5. The random access memory of claim 1, wherein each local bitline multiplexer is configured to be independently controlled from each other, such that two different memory ways can connect to the pair of global read bitlines to reach the bitline operational block.

6. The random access memory of claim 1, wherein the bitline operational block comprises:
a pair of amplifiers operatively connected to outputs of the global read bitline multiplexer;
a pair of latches that are arranged at outputs of the pair of amplifier, respectively; and
an adder circuit operatively connected to each output of the pair of latches.

7. The random access memory of claim 6, wherein the bitline operational block further comprises:
a operation multiplexer operatively connected to outputs of the adder circuit; and
a writeback circuit.

8. The random access memory of claim 1, further comprising:
a word line driver operatively connected to word lines of the memory array;
two word line decoders operatively connected to inputs of the word line driver to provide for decoded addresses;
a word line fusion circuit operatively connected to the decoded addresses; and
a subarray controller having a multiplication controller.

9. The random access memory of claim 1, wherein the bitline operational block is configured to perform the arithmetic operation, the arithmetic operation including a shift operation.

10. The random access memory of claim 1, wherein the bitline operational block is configured to perform the logic operation, the logic operation including at least one of an ADD, NOR, or XOR operation.

11. A memory chip having a plurality of random access memory arrays, each memory array comprising:
- a plurality of local memory group ways, each local memory group way including,
  - a plurality of local memory groups, each local memory group including,
    - a memory column including a plurality of memory cells,
    - a pair of local bitlines operatively connected to the plurality of memory cells, and
    - a local group periphery including a local bitline multiplexer operatively connected with the pair of local bitlines of the corresponding local memory group; and
  - a pair of global read bitlines operatively connected to outputs of the plurality of local group peripheries;
- a global read bitline multiplexer operatively connected to outputs of the plurality of pairs of the global read bitlines from the local memory group ways; and
- a bitline operational block operatively connected to an output of the global read bitline multiplexer, the bitline operational block configured to perform at least one of a logic or arithmetic operation.

12. The memory chip of claim 11, wherein the local group periphery comprises:
- a pair of local amplifiers having inputs that are connected to outputs of the local bitline multiplexer;
- a pair of local read ports each associated with a corresponding one of the local amplifiers; and
- a pair of embedded shift circuits operatively connected to the pair of local read ports, respectively, outputs of the pair of shift circuits providing for an embedded shift number, operatively connected to a corresponding one of the pair of global read bitlines.

13. The memory chip of claim 11, wherein the local bitline multiplexer is configured to connect a selected pair of local bitlines of a corresponding local memory group to inputs of a pair of amplifiers of the local group periphery.

14. The memory chip of claim 12, wherein each memory array further comprises:

a local control logic block for controlling the pair of embedded shift circuits, such that a register of a corresponding one of the embedded shift circuit is shifted depending on a word structure.

15. The memory chip of claim 11, wherein each local bitline multiplexer is configured to be independently controlled from each other, such that two different memory ways can connect to the pair of global read bitlines to reach the bitline operational block.

16. The memory chip of claim 11, wherein the bitline operational block comprises:
- a pair of amplifiers operatively connected to outputs of the global read bitline multiplexer;
- a pair of latches that are arranged at outputs of the pair of amplifier, respectively; and
- an adder circuit operatively connected to each output of the pair of latches.

17. The memory chip of claim 16, wherein the bitline operational block further comprises:
- an operation multiplexer operatively connected to outputs of the adder circuit; and
- a writeback circuit.

18. The memory chip of claim 11, wherein each memory array further comprises:
- a word line driver operatively connected to word lines of the memory array;
- two word line decoders operatively connected to inputs of the word line driver to provide for decoded addresses;
- a word line fusion circuit operatively connected to the decoded addresses; and
- a subarray controller having a multiplication controller.

19. The memory chip of claim 11, wherein the bitline operational block is configured to perform the arithmetic operation, the arithmetic operation including a shift operation.

20. The memory chip of claim 11, wherein the bitline operational block is configured to perform the logic operation, the logic operation including at least one of an ADD, NOR, or XOR operation.

* * * * *